(12) United States Patent
Brown et al.

(10) Patent No.: US 10,481,497 B2
(45) Date of Patent: Nov. 19, 2019

(54) MAINTAINING CONSISTENT DARKNESS LEVELS PRODUCED BY A PHOTOCONDUCTIVE DRUM DURING THE LIFE OF THE PHOTOCONDUCTIVE DRUM

(71) Applicant: LEXMARK INTERNATIONAL, INC., Lexington, KY (US)

(72) Inventors: Michael Wesley Brown, Winchester, KY (US); Mark Edwin Kirtley Lund, Lexington, KY (US); Steven Alan Seng, Lexington, KY (US)

(73) Assignee: LEXMARK INTERNATIONAL, INC., Lexington, KY (US)

( * ) Notice: Subject to any disclaimer, the term of this patent is extended or adjusted under 35 U.S.C. 154(b) by 0 days.

(21) Appl. No.: 16/109,825

(22) Filed: Aug. 23, 2018

(65) Prior Publication Data

US 2019/0171110 A1 Jun. 6, 2019

Related U.S. Application Data

(62) Division of application No. 15/728,580, filed on Oct. 10, 2017, now Pat. No. 10,197,938.

(51) Int. Cl.
| | | |
|---|---|---|
| *G03G 5/043* | (2006.01) | |
| *G03F 7/20* | (2006.01) | |
| *G03G 15/02* | (2006.01) | |
| *G03G 15/043* | (2006.01) | |
| *G03G 15/00* | (2006.01) | |
| *G03G 15/041* | (2006.01) | |

(52) U.S. Cl.
CPC ...... *G03F 7/70025* (2013.01); *G03F 7/70491* (2013.01); *G03G 15/0266* (2013.01); *G03G 15/041* (2013.01); *G03G 15/043* (2013.01); *G03G 15/751* (2013.01)

(58) Field of Classification Search
CPC ............ G03F 7/70025; G03F 7/70491; G03G 15/041; G03G 15/0266; G03G 15/751; G03G 15/043
See application file for complete search history.

(56) References Cited

U.S. PATENT DOCUMENTS

| | | | | |
|---|---|---|---|---|
| 2011/0037822 | A1* | 2/2011 | Schaffstein | G03G 15/326 347/234 |
| 2013/0279934 | A1* | 10/2013 | Hasegawa | G03G 21/10 399/71 |

* cited by examiner

*Primary Examiner* — Yaovi M Ameh

(57) ABSTRACT

An imaging device has a photoconductive drum with a surface that is charged and selectively discharged to create a latent electrostatic image of an image to-be-printed for attracting toner for transfer to a media. A memory of the imaging device stores energy density values for use by the laser beam that can be accessed by a controller according to a predetermined number of media imaged by the photoconductive drum. During imaging, the controller controls the laser beam based on the stored energy density values. The energy density of the laser beam is increased or decreased when the laser beam is scanned along the photoconductive drum.

4 Claims, 3 Drawing Sheets

MAINTAINING CONSISTENT DARKNESS LEVELS PRODUCED BY A PHOTOCONDUCTIVE DRUM DURING THE LIFE OF THE PHOTOCONDUCTIVE DRUM

This application claims priority as a divisional of U.S. patent application Ser. No. 15/728,580, filed Oct. 10, 2017, having the same title.

FIELD OF THE EMBODIMENTS

The present disclosure relates to imaging using a photoconductive drum in an imaging device. It relates further to maintaining uniform darkness produced by the photoconductive drum over its lifetime.

BACKGROUND

In imaging devices which utilize light to form images, optical scanning systems are incorporated to scan laser beams from one or more light sources onto a photoconductive (PC) drum. A PC drum has a surface that is charged to a uniform potential by a charge roller, corona, etc. and selectively discharged to create a latent electrostatic image for development with toner for transfer to media.

When the coating thickness of the PC drum wears down as the PC drum is used over time, changes in the amount of charge that the PC drum can hold may occur. This affects the toner attracted to the PC drum, and consequently, to the toner that adheres to the media during imaging. The thinning of the PC drum coating therefore affects the darkness level produced by the PC drum which may gradually turn darker or lighter over the life of the PC drum. Some areas of the PC drum may also wear down faster than other areas which further causes inconsistency in the darkness produced by the PC drum. Depletion of toner from an attendant cartridge during use can also affect darkness, as smaller particles of toner first get imaged on the PC drum then larger particles of toner.

These and other factors may cause non-uniform darkness produced by the PC drum which, when left uncorrected, may become noticeable as a print quality defect to a user. As such, there is a need to maintain uniform darkness produced by the PC drum throughout the life of the PC drum.

SUMMARY

The above-mentioned and other problems are solved by methods and apparatus for an imaging device having a photoconductive drum with a surface that is charged and selectively discharged by a laser beam to create a latent electrostatic image of an image to-be-printed for attracting toner for transfer to a media to produce a printed output. In a memory of the imaging device, energy density values are stored according to a predetermined criteria, such as a number of media imaged by the photoconductive drum, revolutions of the drum, toner particle size, or the like. During imaging, a controller of the imaging device accesses the stored energy density values and controls the laser beam as indicated by the stored energy density values. The energy density of the laser beam may be increased or decreased when the laser beam is scanned along the photoconductive drum. The energy density of the laser beam is increased if the photoconductive drum has imaged the predetermined number of media. In one example embodiment, the energy density of the laser beam may be increased when scanning one or more portions of the photoconductive drum having thinner coating thickness compared to an initial coating thickness. In another example embodiment, the energy density of the laser beam may be decreased when scanning one or more portions of the photoconductive drum having thicker coating thickness compared to one or more portions having thinner coating thickness.

These and other embodiments are set forth in the description below. Their advantages and features will become readily apparent to skilled artisans. The claims set forth particular limitations.

DETAILED DESCRIPTION OF THE ILLUSTRATED EMBODIMENTS

In the following detailed description, reference is made to the accompanying drawings where like numerals represent like details. The embodiments are described in sufficient detail to enable those skilled in the art to practice the invention. It is to be understood that other embodiments may be utilized and that changes may be made without departing from the scope of the invention. The following detailed description, therefore, is not to be taken in a limiting sense and the scope of the invention is defined only by the appended claims and their equivalents.

Figure 1:
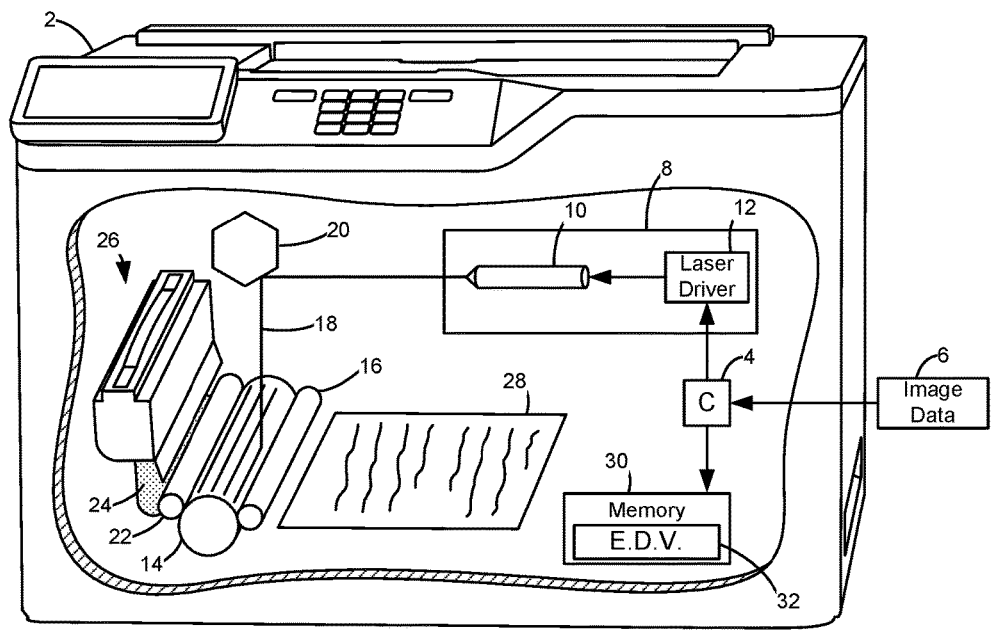
FIG. 1 is a diagrammatic view of an imaging device, including cutaway with a partial diagrammatic view of an imaging process with a PC drum.

FIG. 1 shows an example imaging device 2 including a controller 4 that receives image data 6 to be printed. Imaging device 2 also includes a printhead or a laser scanning unit (LSU) 8 having a laser source 10, and a laser driver 12 that is communicatively connected to controller 4. Controller 4 converts the image data 6 so that an electrostatic image of an image to-be-printed is formed on a photoconductive (PC) drum 14 for attracting toner for transfer to a media. During imaging, the PC drum 14 is charged by the charge roller 16 to a specified voltage. At least one laser beam 18 from LSU 8 is directed to the PC drum 14 via a polygon scanning mirror 20 and discharges the areas on the PC drum 14 to form a latent electrostatic image corresponding to the image data 6. The developer unit 22 then transfers toner 24 from toner cartridge 26 to PC drum 14 to form an image thereon. The toner 24 is attracted to the areas of the PC drum 14 that are discharged by the laser beam 18 from LSU 8. The toner on the surface of the PC drum 14 then gets transferred to a media 28 at a transfer nip to form an imaged media, as is familiar. Imaging device 2 also includes a memory 30 for storing data such as energy density values 32 for use in maintaining consistent darkness levels produced by the PC drum 14, as will be described in greater detail below. The memory includes single or multiple chip memory. The memory of the imaging device can also reside other than where shown, such as on replaceable components like the toner cartridge, LSU, or fuser (not shown). The memory can be also divided in its storage of items that the controller aggregates together as needed.

Figure 2:
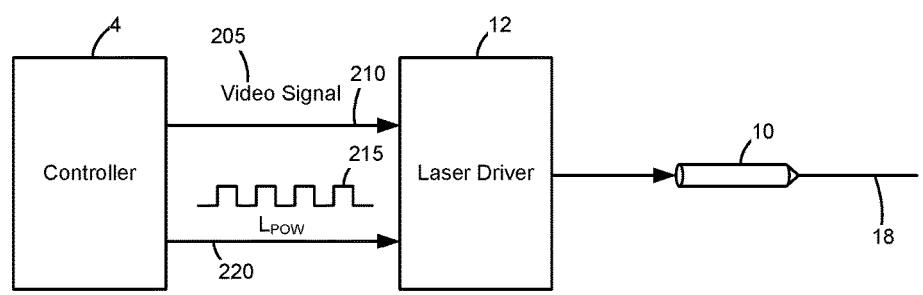
FIG. 2 shows an example diagram illustrating a laser driver of laser scanning unit (LSU) in communication with a controller.

FIG. 2 shows an example diagram illustrating laser driver 12 of LSU 8 in communication with controller 4. Controller 4 generates a laser modulation signal or video signal 205 based on image data 6 and transmits the video signal 205 containing the image data through a first channel 210 to the laser driver 12. The laser driver 12 uses the video signal 205 to modulate the laser beam 18 emitted by laser source 10. A laser modulation signal LPOW 215 is provided by controller 4 to laser driver 12 via a second channel 220 to provide a laser power reference. During a laser scanning operation, laser driver 12 receives both the video signal 205 containing the image data and laser modulation signal LPOW 215. Laser driver 12 modulates the laser beam 18 based on the video signal 205 to form a latent image on the surface of the PC drum and adjusts the power of the laser beam based on the laser modulation signal LPOW 215. The laser modulation signal LPOW 215 may be based on energy density values 32 stored in memory 30 such that the power may be increased or decreased as indicated by the stored energy density values 32.

Figure 3:
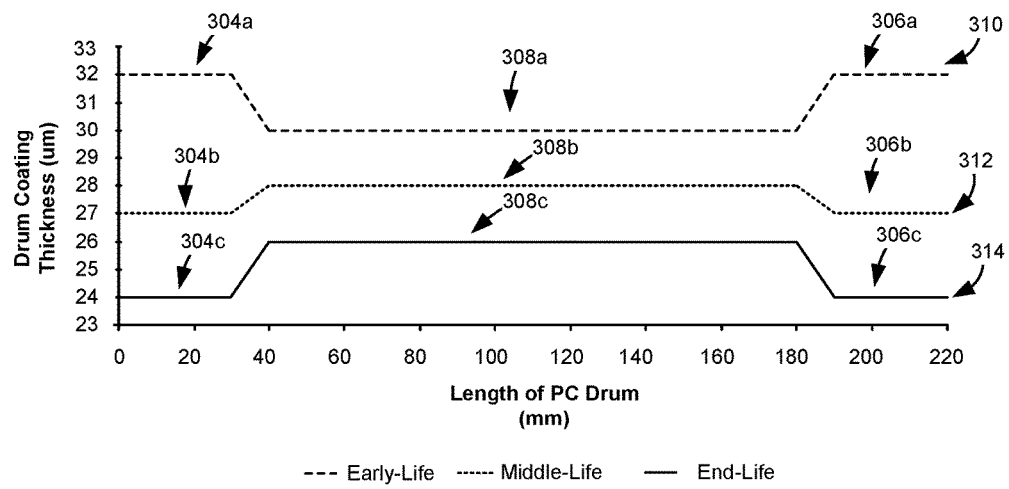
FIG. 3 is a graph showing a comparison of PC drum coating thicknesses across the length of the drum during the PC drum's early, middle, and end life.

FIG. 3 shows a representative graph of a PC drum having different coating thickness in its early-life 310, middle-life 312, and end-life 314, respectively. Owing to known wear, the PC drum may be manufactured with a thicker coating thickness at its end portions 304a and 306a compared to its central portion 308a to compensate for a higher rate of degradation at the end portions 304a and 306a due to contact with edges of the media during imaging. At its early-life 310, the end portions 304a and 306a may have coating thickness of 32 um, and the central portion 308a may have a coating thickness of 30 um. After imaging approximately 20,000 media, the PC drum may reach its middle-life 312. The coating thickness of the PC drum in its middle-life 312 may wear down to about 27 um at the end portions 304b and 306b, and 28 um at the central portion 308b. After imaging approximately 50,000 media, the PC drum may reach its end-life 314 with coating thickness wearing down to approximately 24 um at the end portions 304c and 306c, and 26 um at the central portion 308c.

Figure 4:
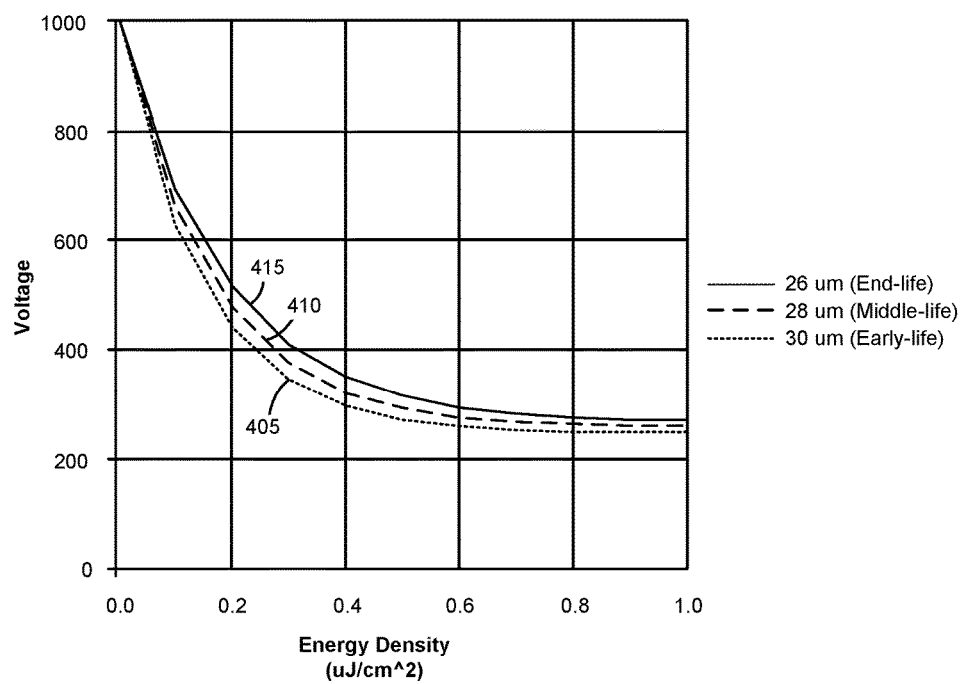
FIG. 4 is a graph showing example voltage levels of a PC drum of varying coating thicknesses in response to a laser beam discharging the PC drum during imaging.

FIG. 4 illustrates different coating thicknesses of the PC drum holding charge when discharged by a laser beam with a specified energy density value. In this example, the different coating thicknesses of the PC drum being discharged corresponds to the coating thicknesses 308a, 308b, and 308c of the central portion of the PC drum in its early-life 405, middle-life 410, and end-of-life 415, respectively.

In the early-life 405 of the PC drum, the PC drum may have a coating thickness of 30 um and may have imaged less than 20,000 media. When discharged by a laser beam with an example energy density value of 0.2 V, the PC drum in its early-life 405 holds charge at approximately 420 volts. After imaging approximately 20,000 media, the PC drum reaches its middle-life 410 and its coating thickness may wear down from its initial thickness of 30 um to 28 um. When discharged by the laser beam with the same energy density value of 0.2 V, the PC drum in its middle-life 410 with coating thickness of 28 um may hold charge at approximately 480 volts. After imaging approximately 50,000 media, the PC drum reaches its end-life 415 and its coating thickness may further wear down to 26 um. When discharged by the laser beam with the energy density of 0.2 V, the PC drum in its end-life 415 with coating thickness of 24 um may hold charge at approximately 510 volts.

Thus, the capacity of the PC drum to hold charge on its surface when discharged by a laser beam with the same energy density value varies for different coating thicknesses. When the PC drum coating becomes thinner after imaging a number of media and over time, the charge the PC drum holds becomes higher, resulting in different amounts of toner attracted to the PC drum during imaging at a later life of the drum. This may change the darkness produced by the PC drum, and consequently the darkness on media imaged by the PC drum at the later life of the drum.

Figure 5:
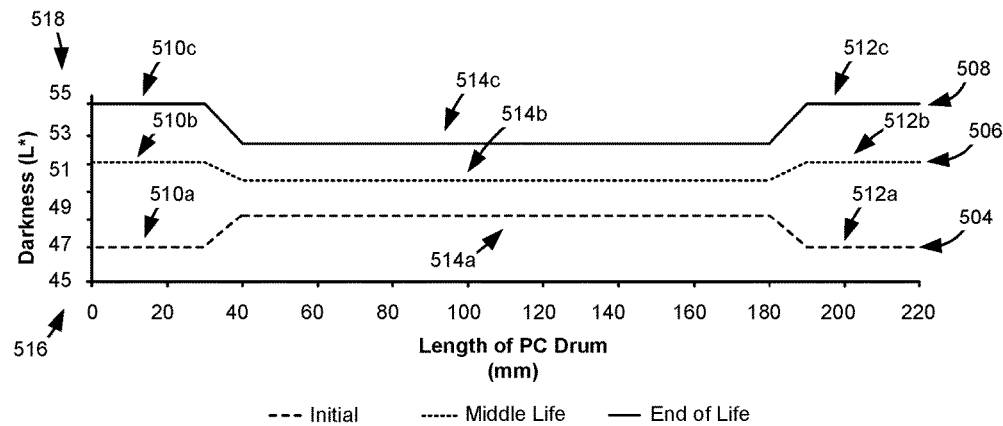
FIG. 5 is a graph showing darkness levels produced by the PC drum on an imaged media across the length of the drum during its early, middle, and end life.

FIG. 5 is a graph illustrating darkness levels produced by the PC drum when the PC drum is discharged by a laser beam with a constant energy density value. The graph shows inconsistency in the darkness levels produced by the PC drum on imaged media, with thicker portions producing darker (i.e., lower L* 516) levels, and thinner portions producing less dark or lighter (i.e., higher L* 518) levels. L* refers to L* of the CIELAB L*a*b* color space which describes colors in three dimensions where L corresponds to lightness, and a and b correspond to the colors green-red and blue-yellow, respectively.

The PC drum in FIG. 5 may have coating thicknesses in its early-life 504, middle-life 506, and end-life 508 similar to the coating thicknesses shown in FIG. 3. In this example, however, the controller of the imaging device may drive the LPOW at ~24% duty cycle to produce an energy density of the laser beam at approximately 0.2 uJ/cm^2 when discharging the PC drum during imaging.

In the early-life 504 of the PC drum, the drum may have coating thickness of 30 um in central portion 514a, and 32 um at end portions 510a and 512a. When discharged by a laser beam having an energy density at approximately 0.2 uJ/cm^2, central portion 514a may produce darkness of about 48.6 L*. End portions 510a and 512a, having thicker coating thickness of 32 um, may produce darkness of about 47 L*.

After imaging about 20,000 media, the PC drum may reach its middle-life 506. Coating thickness in the central portion 514b may wear down to 28 um, while coating thickness of end portions 510b and 512b may wear down to 27 um. Central portion 514b may produce darkness of about 50.5 L*, while end portions 510b and 512b produce darkness level of 51.2 L*.

The PC drum may reach its end-life 508 after imaging about 50,000 media. Coating thickness of the central portion may wear down to about 26 um, and may produce darkness of about 52.5 L* when discharged by the laser beam having an energy density at approximately 0.2 uJ/cm^2, while end portions 510c and 512c may wear down to 24 um and produce darkness level of about 54.75 L*.

Thus, FIG. 5 shows that the darkness levels produced by the PC drum are lighter on thinner portions of the PC drum and at a later life of the drum, and this inconsistency may be noticeable as a quality defect to the user. It is therefore desirable to make adjustments during the life of the PC drum so as to maintain the initial and/or expected darkness level to be produced by the PC drum throughout its life.

In one example embodiment, the wearing down of the PC drum coating thickness and the corresponding darkness levels produced by the different coating thicknesses may be pre-determined. The coating thickness of the PC drum may be determined as the PC drum is used over time such as, for example, after imaging a predetermined number of media (e.g., every 20,000 media imaged). In another example, the coating thickness of the PC drum may be determined after a number of PC drum revolutions. Revolutions occur when a toner image is transferred from the PC drum, but also when there is no transfer, with each instance of revolution causing surface degradation or wearing down of the PC drum coating. After a predetermined number of revolutions have occurred, coating thickness of the PC drum is measured.

In another example embodiment, the amount of charge the PC drum holds after being discharged by a laser beam having a specific energy density value may be measured for different coating thicknesses of the drum (as shown in FIG. 4). The darkness levels produced by the PC drum in response to the specific energy density of the laser beam and for different coating thicknesses of the PC drum may also be determined (as shown in FIG. 5).

After determining the different coating thicknesses of the PC drum during its early, middle, and end life (as shown in FIG. 4), and the corresponding darkness levels produced by the different coating thicknesses (as shown in FIG. 5), different energy density values for the laser beam may be derived. That is, different energy density values of the laser beam are calculated based on the amount of charge the PC drum can hold due to changes in its coating thickness, such that the different energy density values still allows the PC drum to produce substantially consistent darkness levels when imaging media throughout its lifetime. In another embodiment, the energy density values are calculated based on the darkness levels produced by different coating thicknesses of the PC drum.

Figure 6:
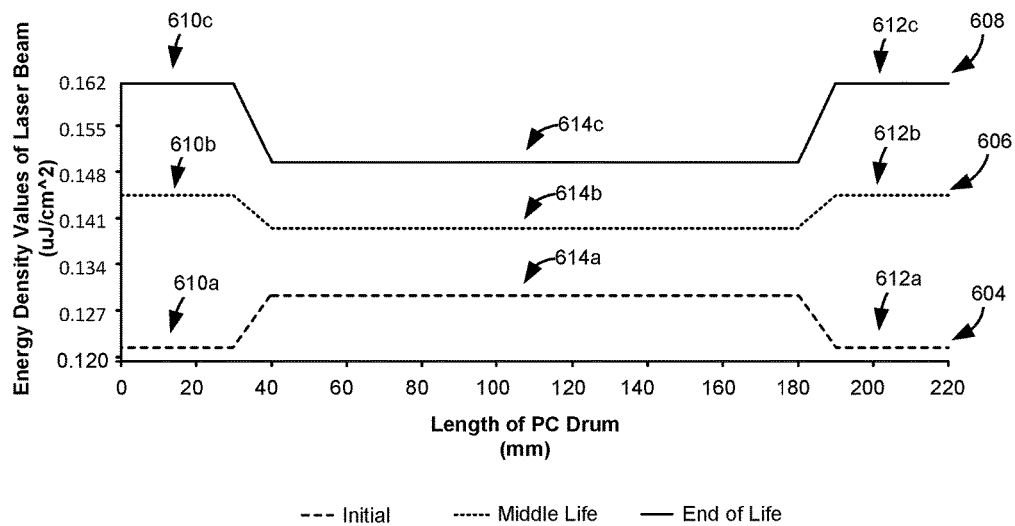
FIG. 6 is a graph showing energy density values of the laser beam scanned along the length of the PC drum.

FIG. 6 is a representative graph showing energy density values of a laser beam scanned along the length of the PC drum. Based on the coating thickness of the PC drum throughout its life, the energy density values of the laser beam may be increased or decreased to offset the changes in the amount of charge the PC drum holds. The energy density values of the laser beam are increased or decreased to maintain uniform darkness produced by the PC drum over its lifetime.

As shown in FIG. 4, in one example embodiment, the darkness level of about 48.6 L* produced at the central portion 514a during the PC drum's early-life 504 is the darkness level that needs to be substantially maintained throughout the life of the PC drum. In this example embodiment, the PC drum may have coating thicknesses in its early-life 604, middle-life 606, and end-life 608 similar to the coating thicknesses in the early-life 310, middle-life 312, and end-life 314 of the PC drum shown in FIG. 3. The PC drum may produce different darkness levels in its early-life 504, middle-life 506, and end-life 508 as illustrated in FIG. 5.

With continued reference to FIG. 6, to ensure that the PC drum produces substantially 48.6 L* darkness level in its early-life 604, energy density values of the laser beam may be set to about 0.122 uJ/cm^2 when the laser beam is scanned at end portions 610a and 612a, and 0.129 uJ/cm^2 when scanned at central portion 614a.

In the middle-life 606 of the PC drum, the coating thickness at the end portions 610b and 612b may wear down to 27 um, and 28 um at the central portion 614b, producing darkness levels of 51 L* and 50.7 L*, respectively. To ensure that the entire PC drum produces substantially 48.6 L* darkness during its middle-life 606, the energy density of the laser beam may be increased at 0.145 uJ/cm^2 as the laser beam is scanned at the end portions 610b and 612b, and 0.140 uJ/cm^2 as the laser beam is scanned at the central portion 614b.

Similarly, when the PC drum reaches end-life 608, the coating thickness at the end portions 610c and 612c may wear down to 24 um, and 26 um at the central portion 614c, producing darkness levels of 54.6 L* and 52.5 L*, respectively. To ensure that the PC drum produces substantially 48.6 L* darkness in end-life 608, the energy density may be increased to 0.162 uJ/cm^2 as the laser beam is scanned at the end portions 610c and 612c, and 0.150 uJ/cm^2 as the laser beam is scanned at the central portion 614c.

Since the PC drum coating thickness wears down as the PC drum is used, the energy density of the laser beam needed to substantially maintain the expected darkness level is higher as the PC drum approaches its end-life 608 compared to its early-life 604, and middle-life 604. In addition, the laser beam may also be controlled to have a higher energy density value when the beam is scanned along portions of the PC drum that wear down faster and have thinner coating thickness compared to other portions. In portions of the PC drum having thicker coating compared to other portions, the laser beam may be controlled to have a lower energy density value when it is scanned along the thicker portions.

The energy density values of the laser beam may be provided in one or more look-up tables that include the energy density values determined based on the coating thicknesses in different portions of the PC drum in the early 604, middle 606, and end-life 608. The energy density values (E.D.V.) 32 may be stored in the memory 30 of the imaging device and may be accessed by the controller to drive the LPOW to produce higher or lower power for controlling the energy density values of the laser beam as the laser beam is scanned on portions across the PC drum surface. The energy density values of the laser beam may be increased or decreased using a shade circuit at the laser driver that modulates the laser beam. In an alternative example embodiment, the energy density values are stored in a memory of the LSU and controller 4 may access the values from the memory of the LSU during imaging.

In an alternative example embodiment, manufacturing processes of the PC drum may also be considered when deriving the energy density values needed to maintain the expected darkness level produced by the PC drum. For example, the dip time of the PC drum when dip coating the drum to form the one or more photoconductive film layers may be determined to produce a specific coating thickness of the PC drum. As the PC drum is used over time, the wearing down of the coating thickness after imaging a predetermined number of media may be identified, along with the darkness levels produced by the PC drum having a specific coating thickness. Using this data, the correlation between the dip time of the PC drum during manufacturing, the coating thickness of the drum, the wearing down of the coating thickness through use, and the darkness levels produced by the PC drum in the different coating thicknesses may be established. This correlation may be used to derive the energy density values needed to maintain the darkness level produced by the PC drum during imaging.

Other factors that may be considered include the photoconductive film formulations and known charge that formulations hold when discharged with specific energy density values. Different film formulations may be tested to check the charge they hold when discharged with a specific energy density value, and consequently, the corresponding darkness levels produced by drums made of different film formulations. The darkness levels produced by the drums may then be used to derive the energy density values needed to maintain the expected darkness level.

In one example embodiment, the energy density values stored in the imaging device may be customized based on the attributes of the specific system that utilizes the energy density values during imaging. For example, an imaged media may be scanned using a scanner to determine any inconsistency in the darkness produced by the PC drum on the imaged media. Updated energy density values may then be derived based on the imaged media as analyzed by the scanner, wherein higher energy density values are used in portions of the PC drum with thicker coating thickness and lower energy density values are used in portions with thinner coating thickness. A user of the imaging device may utilize this alternative method at a later life of the imaging device. For example, the user may print a special media through a calibration menu setting, and the darkness produced by the PC drum as seen on the imaged media may be analyzed by the scanner in order to determine the current darkness of the imaged media and determine optimal energy density values based on the current darkness.

In one example embodiment, the wearing down of the PC drum coating may be empirically predetermined for a population of PC drums by testing a subset of the PC drums that are manufactured in a controlled manner. For example, for a population of PC drums that have been manufactured using a known set of attributes such as an initial coating thickness of the PC drum, a subset of these PC drums may be used to image a number of media and the darkness levels produced by the PC drums after imaging the number of media may be determined. The testing process may be used to determine the wearing down of the PC drums' coating thickness and the corresponding changes in darkness levels produced by the drums.

The foregoing illustrates various aspects of the invention. It is not intended to be exhaustive. Rather, it is chosen to provide the best illustration of the principles of the invention and its practical application to enable one of ordinary skill in the art to utilize the invention. All modifications and variations are contemplated within the scope of the invention as determined by the appended claims. Relatively apparent modifications include combining one or more features of various embodiments with features of other embodiments. All quality assessments made herein need not be executed in total and can be done individually or in combination with one or more of the others.

The invention claimed is:

1. In an imaging device having a photoconductive drum including a surface that is selectively discharged by a laser beam to form a latent electrostatic image for attracting toner for transfer to a media, a method comprising:
   storing in a memory of the imaging device energy density values for the laser beam according to a coating thickness of the photoconductive drum that can be accessed by a controller to control the laser beam; and
   controlling by the controller the laser beam based on the stored energy density values by increasing or decreasing energy density of the laser beam when the laser beam is scanned along the photoconductive drum, wherein the controlling further includes increasing the energy density of the laser beam as the laser beam is scanned at end portions of the photoconductive drum and wherein the increasing the energy density of the laser beam when the laser beam is scanned at the end portions is performed when the photoconductive drum has imaged less than a predetermined number of media.

2. The method of claim 1, wherein the controlling further includes increasing the energy density of the laser beam as the laser beam is scanned on one or more portions of the photoconductive drum having thinner coating thickness compared to an initial coating thickness of the photoconductive drum.

3. The method of claim 1, wherein the controlling further includes decreasing the energy density of the laser beam as the laser beam is scanned on one or more portions of the photoconductive drum having thicker coating thickness compared to the one or more portions having thinner coating thickness.

4. The method of claim 1, wherein the controlling further includes decreasing the energy density of the laser beam as the laser beam is scanned at a central portion of the photoconductive drum.

\* \* \* \* \*